US011003053B2

(12) United States Patent
Butterworth

(10) Patent No.: US 11,003,053 B2
(45) Date of Patent: *May 11, 2021

(54) THIN LED FLASH FOR CAMERA

(71) Applicant: Lumileds LLC, San Jose, CA (US)

(72) Inventor: Mark Melvin Butterworth, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/717,781

(22) Filed: Dec. 17, 2019

(65) Prior Publication Data

US 2020/0124941 A1 Apr. 23, 2020

Related U.S. Application Data

(63) Continuation of application No. 16/377,886, filed on Apr. 8, 2019, now Pat. No. 10,564,520, which is a (Continued)

(51) Int. Cl.
*H01L 33/50* (2010.01)
*G03B 15/05* (2021.01)
(Continued)

(52) U.S. Cl.
CPC ............ *G03B 15/05* (2013.01); *H01L 33/505* (2013.01); *H01L 33/58* (2013.01); *H01L 33/60* (2013.01);
(Continued)

(58) Field of Classification Search
CPC .......................... G03B 15/05; G03B 2215/0567; G03B 15/03; G03B 2215/05; H01L 33/505;
(Continued)

(56) References Cited

U.S. PATENT DOCUMENTS 4,922,280 A 5/1990 Koshino et al.
5,303,084 A 4/1994 Pflibsen et al.
(Continued)

FOREIGN PATENT DOCUMENTS

CN 1538538 A 10/2004
CN 101467269 A 6/2009
(Continued)

OTHER PUBLICATIONS

US 10,288,984 B2, 05/2019, Butterworth (withdrawn)
(Continued)

*Primary Examiner* — Donald L Raleigh
(74) *Attorney, Agent, or Firm* — Schwegman Lundberg & Woessner, P.A.

(57) ABSTRACT

A thin flash module for a camera uses a flexible circuit as a support surface. A blue GaN-based flip chip LED die is mounted on the flex circuit. The LED die has a thick transparent substrate forming a "top" exit window so at least 40% of the light emitted from the die is side light. A phosphor layer conformally coats the die and a top surface of the flex circuit. A stamped reflector having a knife edge rectangular opening surrounds the die. Curved surfaces extending from the opening reflect the light from the side surfaces to form a generally rectangular beam. A generally rectangular lens is affixed to the top of the reflector. The lens has a generally rectangular convex surface extending toward the die, wherein a beam of light emitted from the lens has a generally rectangular shape corresponding to an aspect ratio of the camera's field of view.

20 Claims, 5 Drawing Sheets

Related U.S. Application Data continuation of application No. 16/176,184, filed on Oct. 31, 2018, now Pat. No. 10,324,359, which is a continuation of application No. 15/104,220, filed as application No. PCT/IB2017/067204 on Dec. 22, 2014, now Pat. No. 10,120,266.

(60) Provisional application No. 61/923,925, filed on Jan. 6, 2014.

(51) Int. Cl.
 H01L 33/58 (2010.01)
 H01L 33/60 (2010.01)

(52) U.S. Cl.
 CPC .... G03B 2215/0567 (2013.01); H01L 33/501 (2013.01)

(58) Field of Classification Search
 CPC ....... H01L 33/58; H01L 33/60; H01L 33/501; H01L 33/02; H01L 2924/12041; G02B 7/105
 See application file for complete search history.

(56) References Cited

U.S. PATENT DOCUMENTS

| | | | |
|---|---|---|---|
| 6,381,415 B1 | 4/2002 | Terada | |
| 7,448,783 B2 | 11/2008 | Ohkawa | |
| 7,600,894 B1 | 10/2009 | Simon | |
| 7,626,210 B2 | 12/2009 | Shchekin et al. | |
| 7,932,525 B2 | 4/2011 | Osamu | |
| 8,097,894 B2 | 1/2012 | Bierhuizen et al. | |
| 8,273,586 B2 | 9/2012 | Tachibana | |
| 8,288,936 B2 | 10/2012 | Ohta et al. | |
| 8,742,433 B2 | 6/2014 | Ajiki et al. | |
| 9,196,805 B2 | 11/2015 | Yamada et al. | |
| 10,120,266 B2 | 11/2018 | Butterworth | |
| 10,324,359 B2 | 6/2019 | Butterworth | |
| 10,564,520 B2 | 2/2020 | Butterworth | |
| 2003/0008431 A1 | 1/2003 | Matsubara et al. | |
| 2005/0093116 A1 | 5/2005 | Palmteer et al. | |
| 2005/0247944 A1 | 11/2005 | Haque et al. | |
| 2006/0049421 A1 | 3/2006 | Suehiro et al. | |
| 2007/0097696 A1 | 5/2007 | Eng et al. | |
| 2007/0284600 A1 | 12/2007 | Shchekin et al. | |
| 2008/0128732 A1 | 6/2008 | Haruna et al. | |
| 2008/0186737 A1 | 8/2008 | Awai et al. | |
| 2010/0148198 A1 | 6/2010 | Sugizaki et al. | |
| 2010/0265723 A1 | 10/2010 | Zhou | |
| 2010/0283069 A1 | 11/2010 | Rogers et al. | |
| 2011/0018017 A1 | 1/2011 | Bierhuizen et al. | |
| 2011/0123184 A1 | 5/2011 | Mather et al. | |
| 2011/0193105 A1 | 8/2011 | Lerman et al. | |
| 2011/0299044 A1 | 12/2011 | Yeh et al. | |
| 2012/0147147 A1 | 6/2012 | Park et al. | |
| 2013/0076230 A1 | 3/2013 | Watanabe et al. | |
| 2013/0148348 A1 | 6/2013 | Streppel | |
| 2013/0149508 A1 | 6/2013 | Kwak et al. | |
| 2013/0223060 A1 | 8/2013 | Castillo | |
| 2013/0258676 A1 | 10/2013 | Hyun et al. | |
| 2015/0153023 A1 | 6/2015 | Jepsen et al. | |
| 2016/0320689 A1 | 11/2016 | Butterworth | |
| 2017/0084803 A1 | 3/2017 | Iwaki | |
| 2019/0064635 A1 | 2/2019 | Butterworth | |
| 2019/0250486 A1 | 8/2019 | Butterworth | |

FOREIGN PATENT DOCUMENTS

| | | | |
|---|---|---|---|
| CN | 103003967 A | 3/2013 | |
| EP | 1467417 A2 | 10/2004 | |
| EP | 3092667 A1 | 11/2016 | |
| JP | H11-38897 A | 2/1999 | |
| JP | 2004-327955 A | 11/2004 | |
| JP | 2005-322937 A | 11/2005 | |
| JP | 2007-173322 A | 7/2007 | |
| JP | 2008-300386 A | 12/2008 | |
| JP | 2009-016779 A | 1/2009 | |
| JP | 2010-238837 A | 10/2010 | |
| JP | 2011-003706 A | 1/2011 | |
| JP | 2012-533902 A | 12/2012 | |
| JP | 2013-069980 A | 4/2013 | |
| JP | 2013-219398 A | 10/2013 | |
| KR | 20120079665 A | 7/2012 | |
| WO | WO-2007/141763 A1 | 12/2007 | |
| WO | WO-2015/101899 A1 | 7/2015 | |

OTHER PUBLICATIONS

"U.S. Appl. No. 16/377,886, Corrected Notice of Allowability dated Jan. 8, 2020", 2 pgs.
"Chinese Application Serial No. 201480072446.3, Response filed Mar. 2, 2020 to Notice of Reexamination dated Nov. 27, 2019", w/ English Claims, 12 pgs.
"U.S. Appl. No. 15/104,220, 312 Amendment filed Apr. 24, 2018", 7 pgs.
"U.S. Appl. No. 15/104,220, Final Office Action dated Sep. 12, 2017", 13 pgs.
"U.S. Appl. No. 15/104,220, Non-Final Office Action dated Apr. 19, 2017", 13 pgs.
"U.S. Appl. No. 15/104,220, Notice of Allowance dated Jan. 24, 2018", 10 pgs.
"U.S. Appl. No. 15/104,220, Notice of Allowance dated Jul. 2, 2018", 8 pgs.
"U.S. Appl. No. 15/104,220, Preliminary Amendment filed Jun. 13, 2016", 5 pgs.
"U.S. Appl. No. 15/104,220, Response filed Jul. 18, 2017 to Non-Final Office Action dated Apr. 19, 2017", 8 pgs.
"U.S. Appl. No. 15/104,220, Response filed Dec. 12, 2017 to Final Office Action dated Sep. 12, 2017", 14 pgs.
"U.S. Appl. No. 16/176,184, Corrected Notice of Allowability dated May 20, 2019", 2 pgs.
"U.S. Appl. No. 16/176,184, Notice of Allowability dated Feb. 25, 2019", 2 pgs.
"U.S. Appl. No. 16/176,184, Notice of Allowance dated Jan. 8, 2019", 8 pgs.
"U.S. Appl. No. 16/377,886, Corrected Notice of Allowability dated Nov. 14, 2019", 2 pgs.
"U.S. Appl. No. 16/377,886, Notice of Allowance dated Sep. 16, 2019", 9 pgs.
"U.S. Appl. No. 16/377,886, Preliminary Amendment filed May 3, 2019", 7 pgs.
"Chinese Application Serial No. 201480072446.3, Decision of Rejection dated Mar. 12, 2019", w/English Translation, 11 pgs.
"Chinese Application Serial No. 201480072446.3, Notice of Reexamination dated Nov. 27, 2019", (w/ English Translation), 13 pgs.
"Chinese Application Serial No. 201480072446.3, Request for Reexamination dated Jun. 5, 2019", (w/ English Translation of Claims), 13 pgs.
"European Application Serial No. 14833271.1, Intention to Grant dated Dec. 12, 2018", 23 pgs.
"International Application Serial No. PCT/IB2014/067204, International Preliminary Report on Patentability dated Jul. 21, 2016", 8 pgs.
"International Application Serial No. PCT/IB2014/067204, International Search Report dated Mar. 27, 2015", 3 pgs.
"International Application Serial No. PCT/IB2014/067204, Written Opinion dated Mar. 27, 2015", 5 pgs.
"Japanese Application Serial No. 2016-544435, Notification of Reasons for Refusal dated Nov. 5, 2019", (w/ English Translation), 14 pgs.
"Japanese Application Serial No. 2016-544435, Notification of Reasons for Rejection dated Dec. 4, 2018", (w/ English Translation), 10 pgs.
"Japanese Application Serial No. 2016-544435, Response filed May 31, 2019 to Notification of Reasons for Rejection dated Dec. 4, 2018", (w/ English Translations of Claims, 6 pgs.

(56) References Cited

OTHER PUBLICATIONS

U.S. Appl. No. 15/104,220, filed Jun. 13, 2016, Thin LED Flash for Camera, U.S. Pat. No. 10,120,266.
U.S. Appl. No. 16/176,184, filed Oct. 31, 2018, Thin LED Flash for Camera, U.S. Pat. No. 10,324,359.
U.S. Appl. No. 16/377,886, filed Apr. 8, 2019, Thin LED Flash for Camera.
"Japanese Application Serial No. 2016-544435, Examiners Decision of Final Refusal dated Oct. 6, 2020", with English Translation, 13 pgs.
"Japanese Application Serial No. 2016-544435, Response filed Apr. 30, 2020 to Notification of Reasons for Refusal dated Nov. 5, 2019", (w/ English Translation), 10 pgs.

THIN LED FLASH FOR CAMERA

CROSS REFERENCE TO RELATED APPLICATIONS

This application is a continuation of U.S. patent application Ser. No. 15/104,220 filed Jun. 13, 2016, which is a 35 U.S.C. § 371 application of and claims the benefit of International Application No. PCT/IB2014/067204 filed Dec. 22, 2014, which claims the benefit of U.S. Provisional Application No. 61/923,925 filed Jan. 6, 2014, which are incorporated by reference as if fully set forth.

FIELD OF INVENTION

This invention relates to packaged phosphor-converted light emitting diodes (pcLEDs) and in particular, to a packaged pcLED that is useful as a flash for a camera.

BACKGROUND

In modern digital cameras, including smartphone cameras, it is common to provide a flash that uses a pcLED. A common flash is a GaN-based blue LED die mounted in a round reflective cup on a rigid printed circuit board. A layer of YAG phosphor (emits yellow-green) fills the cup. Since the LED die is very thin, almost all light is emitted from the top surface of the die. A circular Fresnel lens is then positioned over the cup to create a generally conical light emission pattern (having a circular cross-section) to illuminate a subject for the photograph. A cover plate, forming part of the camera body, typically has a circular opening for the lens.

Since the field of view of the camera is rectangular, much of the light emitted from the flash, having a circular cross-section, illuminates areas surrounding the subject and is wasted. Such unnecessary illumination may also be bothersome to those not in the picture.

Further, due to the shape of the cup and the phosphor in the cup, the phosphor is not uniform over the LED die, resulting in color non-uniformity vs. angle.

Further, due to the use of the rigid printed circuit board, the thinness of the flash module is limited.

Further, the lens must be spaced away from the top surface of the LED die by a certain minimum distance (e.g., the focal length) in order to properly redirect the light. This minimum distance significantly adds to the thickness of the flash module.

Further, there is substantial back-reflection from the lens back toward the cup and LED die.

Further, the bottom inner edge of the reflector cup facing the sides of the LED die has a thickness that is typically greater than the height of the LED semiconductor layers, so the inner edge of the cup blocks the side light or reflects it back into the LED die.

Further, since almost all light is emitted from the top surface of the LED die, the reflective cup has limited usefulness in shaping the beam, and the resulting beam is not very uniform across the field of view of the camera.

Further, since almost all light is emitted from the top surface of the LED die in a Lambertian pattern, the reflector cup has to have relative high walls to redirect and collimate the "angled" light emitted from the LED die. Any light rays that are not reflected (collimated) spread out at wide angles. The high walls of the reflector limit the minimum thickness of the flash module.

It is known to affix a lens over the LED die for a flash, where the lens has a cavity for the LED die, such as described in patent publication KR2012079665A. The lens has a rectangular top surface and curved side surfaces. However, a significant portion of the light escapes from the sides and is not reflected toward the subject. Also, the prior art lens is relatively thick, resulting in a thick flash module.

What is needed is a thin LED flash module for a camera that more uniformly anti efficiently illuminates a subject.

SUMMARY

In one example of the inventive flash module for a camera, a blue flip-chip LED die has a relatively thick transparent substrate on its top surface. This causes a significant portion of the light emission to be from the sides of the LED die, such as 50% of the total light emission.

A conformal coating of phosphor is deposited over the top and side surfaces of the LED die to create a uniform white light.

The pcLED is mounted on a supporting substrate having a metal pattern for connection to the bottom anode and cathode electrodes of the LED die. The substrate has bottom metal pads for bonding to a cameras printed circuit board. The substrate can be a very thin flex circuit or a rigid substrate such as ceramic.

A rectangular reflector, with rounded corners, is then mounted on the substrate surrounding the rectangular LED die. The rectangular reflector has curved walls for redirecting the side LED light into a generally pyramidal beam, having a rectangular cross-section, where the cross-section aspect ratio is similar to the standard aspect ratio of a cameras field of view. In one embodiment, the reflector is stamped aluminum, where the opening for the LED die has knife edges facing the sides of the LED die so virtually all side light is reflected upward rather than being blocked by the inner edges of the opening. Such a knife edge could not be achieved by a molded reflector cup.

A thin lens is affixed over the lop of the reflector, where the lens has a convex side that faces toward the LED die, so the convex portion does not add thickness to the module. The lens not only protects the LED die but increases light extraction due to the convex portion receiving most of the light from the LED die and reflective walls at a substantially normal angle. In contrast to a prior art conventional Fresnel lens, having a flat surface facing the LED die, there is much less back-reflection.

Due to the high percentage of side light being reflected upward by the reflector, the effective optical distance between the lens and the LED die is the sum of the horizontal distance between a side of the LED die and a curved wall of the reflector plus the vertical distance between the curved wall and the lens. Therefore, the lens can be spaced a focal length from the LED die's sides while being much closer to the top surface of the LED die. This allows the flash module to be even thinner. The reflector walls can be more widely spaced from the LED die to further reduce the thinness of the module.

Since a large portion of the light emitted from the LED die is from its sides, the reflector walls can be made relatively shallow, further reducing the thinness of the module.

The convex shape of the lens toward the LED die and the closeness of the lens to the LED top surface cause the lens to intercept a wide angle of the Lambertian light emitted from the top surface of the LED die and slightly redirect it toward the center of the beam, if necessary, to further improve the uniformity of the beam. The convex shape is designed to optimize the uniformity of light across a desired portion of the generally rectangular beam. The lens is not used to significantly shape the beam (but primarily improves uniformity), since the shape of the beam is primarily controlled by the shape of the reflector, in contrast to the prior art.

Accordingly, due to the large percentage of the LED die light being side light and redirected by the rectangular reflector, and the reflected light being blended with the light emitted from the top surface of the LED die, a more uniform rectangular beam of light is emitted by the flash, which generally matches the aspect ratio (e.g., 4:3) of the camera's field of view. Further, the flash module can be made very thin.

Other embodiments are described.

BRIEF DESCRIPTION OF THE DRAWINGS

Elements that are the same or similar are labeled with the same numeral.

DETAILED DESCRIPTION OF THE PREFERRED EMBODIMENT(S)

Figure 1:
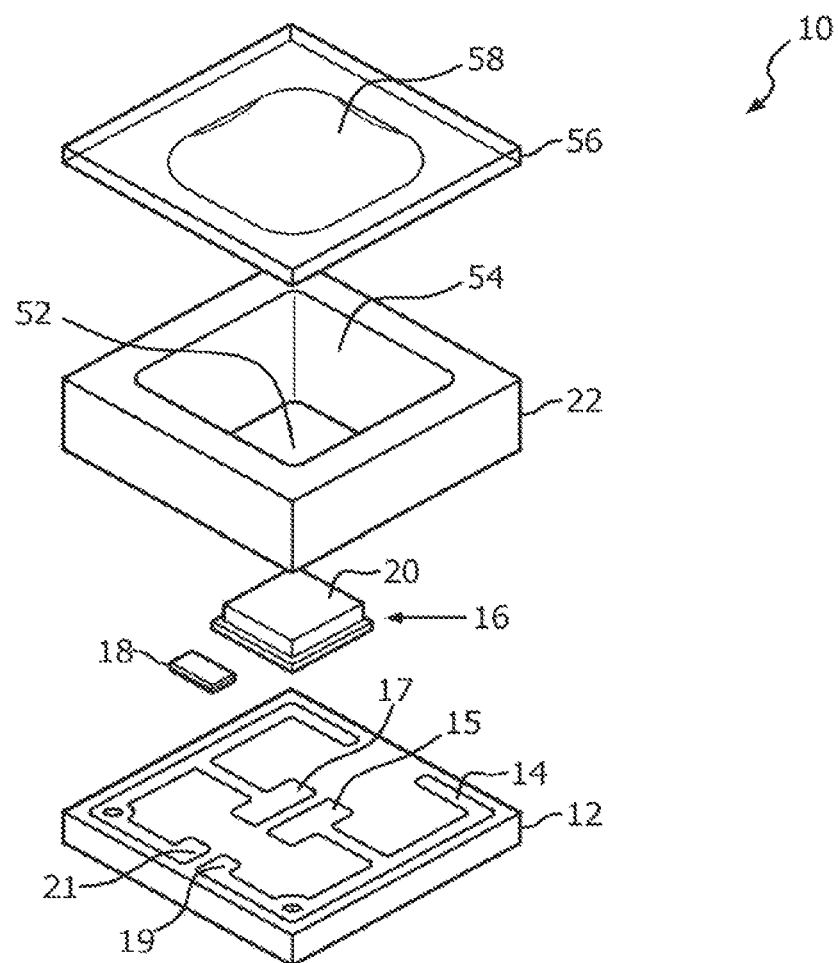
FIG. 1 is an exploded view of a flash module in accordance with one embodiment of the invention.

FIG. 1 is an exploded view of a flash module 10 in accordance with one embodiment of the invention. A support substrate 12 may be a rigid substrate or a very thin flexible circuit. Using a flexible circuit as the support substrate 12 allows the module 10 to be thinner.

A metal trace 14 pattern is formed on the substrate 12 to define metal pads 15 and 17 for the bottom anode and cathode electrodes of the flip chip LED die 16 and to define metal pads 19 and 21 for the electrodes of an optional transient voltage suppressor (TVS) chip 18.

The bare LED die 16, such as a GaN-based blue LED die, is then electrically and thermally connected to the substrate 12. The TVS chip 18 may also be electrically connected to the substrate 12.

Typically, the LED die 16 is a flip chip die, although other die types, including those with bonding wires, may be used. To minimize the thickness of the flash module 10, the LED dies bottom electrodes are directly bonded to the metal pads 15 and 17 of the metal trace 14. In another embodiment, the bare LED die 16 may be first mounted on a submount with more robust bottom metal pads to simplify handling and enable the LED die 16 to be conformally coated with a phosphor layer 20 after bonding to the submount. FIG. 1 shows an alternative embodiment where the phosphor layer 20 covers only the top surface of the LED die 16.

Figure 2:
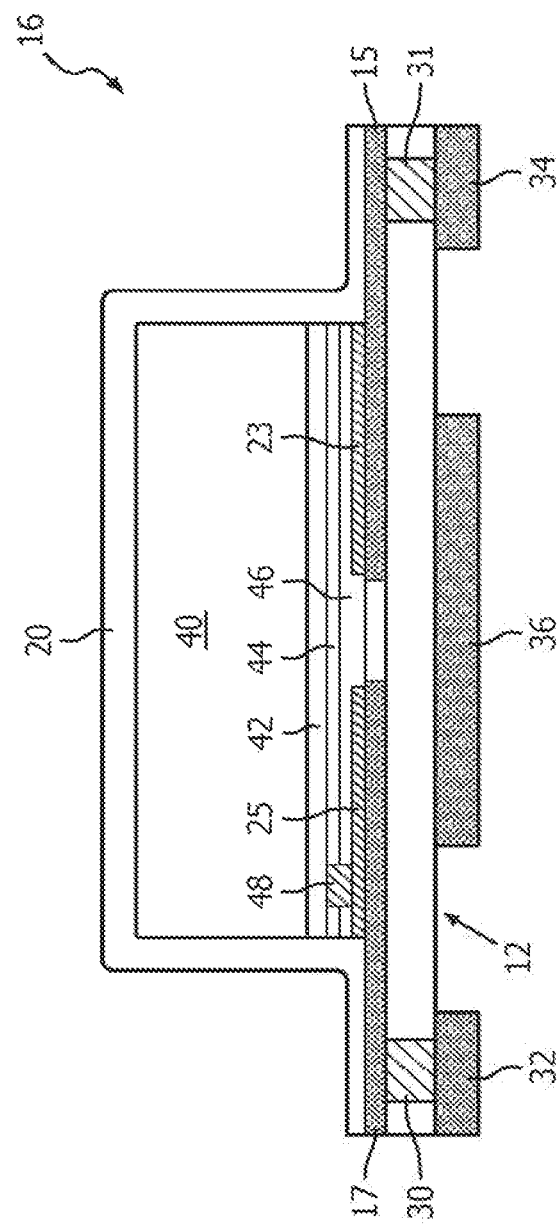
FIG. 2 is a cross-sectional compressed view of an LED die, with a conformal phosphor coating, mounted on a flex circuit (or other supporting substrate) that may be used in the module of FIG. 1.

If the bare LED die 16 is directly mounted on the substrate 12 (as shown in FIG. 2), the phosphor layer 20 may be deposited over the entire substrate 12 and LED die 16 to coat the top and side surfaces of the LED die 16. The phosphor layer 20 may be phosphor particles, such as YAG phosphor particles or red and green phosphor particles, infused in a silicone binder. The phosphor layer 20 may also serve as an adhesive layer for affixing a reflector 22 to the surface of the substrate 12. In the alternative, a separate adhesive may be used to affix the reflector 22.

Various details of the components in FIG. 1 are described with respect to FIGS. 2-8.

FIG. 2 is a cross-sectional compressed view of the LED die 16 with the conformal phosphor layer 20. Although a flip-chip die is shown in the examples, the present invention is applicable to any type of LED die, including vertical LED dies, lateral LED dies, etc.

The LED die 16 includes a bottom anode electrode 23 bonded to the metal pad 15 (defined as a portion of the metal trace 14 of FIG. 1) and includes a bottom cathode electrode 25 bonded to the metal pad 17. The pads 15 and 17 are electrically connected by vias 30 and 31 to associated bottom pads 32 and 34, which may be used to solder the flash module 10 to a camera's printed circuit board. A thermal pad 36 is formed on the bottom surface of the substrate 12, which may be soldered to a heat sink in the printed circuit board.

The LED die 10 semiconductor layers are grown on a relatively thick sapphire substrate 40, which may be as thick as 1 mm. This is thicker than a typical growth substrate, since a manufacturer typically uses the thinnest growth substrate practical for reducing costs and maximizing the top emission. Frequently, in the prior art, the growth substrate is completely removed. The sapphire substrate 40 is much thicker than required for mechanically supporting the LED semiconductor layers. Other material for a growth substrate may instead be used. The top surface and growth surface of the growth substrate 40 may be roughened for increasing light extraction.

A typical width of the LED die 16 is on the order of 1 mm.

N-type layers 42 are epitaxially grown over the sapphire substrate 40, followed by an active layer 44, and p-type layers 46. A portions of the active layer 44 and p-type layers 16 are etched away to gain electrical contact to the n-type layers 42 by means of a via 48 leading to the cathode electrode.

The active layer 44 generates light having a peak wavelength. In the example, the peak wavelength is a blue wavelength, and the layers 42, 44, and 46 are GaN-based.

Alternatively, the growth substrate 40 may be removed and replaced by a transparent support substrate, such as glass, affixed to the semiconductor layers by an adhesive (e.g., silicone) or by other techniques.

By using a thick growth substrate 40 (or other transparent substrate), the light exiting the sides of the LED die 16 is made to be preferably about 50% of the total light emission, with 50% of the total light being emitted from the top surface of the LED die 16. In another embodiment, over 30% of all light emitted by the LED die 16 is from the sides, where the percentage of side light is based on the thickness of the substrate 40. The more side light, the more the reflected light from the reflector 22 is adding to the overall beam and the thinner the flash module can be.

In one embodiment, the thickness of the LED semiconductor layers is less than 100 microns (0.1 mm), and typically less than 20 microns, and the substrate 40 thickness is greater than 0.2 mm and up to 1 mm.

A portion of the blue light leaks through the phosphor layer 20, and the combination of the blue light and phosphor light creates white light for the flash. Since the phosphor layer 20 has a uniform thickness, the color emission will be substantially uniform vs. angle.

The reflector 22 (FIG. 1) is preferable formed by stamping an aluminum sheet. The stamp forms a rectangular opening 52 in the sheet and compresses the surrounding aluminum to form curved sidewalls 54. The term "rectangular," as used herein, includes a square, and includes rectangles with rounded corners. The edges of the opening 52 are knife edges (less than 50 microns thick) to limit any back reflection of the light emitted from the sides of the LED die 16/phosphor. Typically, the opening 52 and curved sidewalls 54 have the same aspect ratio as the camera's field of view, such as 4:3, so the resulting beam will resemble the 4:3 aspect ratio.

The reflector 22 is then coated with a silver layer for high reflectivity, such as by plating, evaporation, sputtering, etc.

The footprint of the reflector 22 may be approximately that of the substrate 12 to minimize the size of the flash module 10. The reflector 22 is then affixed to the substrate 12 using the phosphor layer 20 (containing silicone) as an adhesive. The reflector 22 adds rigidity to the module 10. Tire phosphor layer 20 is then cured.

A preformed polycarbonate lens 56 is then affixed to the top surface of the reflector 22, such as by silicone. The silicone is then cured to complete the flash module 10. Typically, the lens 56 is rectangular with rounded edges to receive the generally rectangular emission from the reflector 22 and LED die 16.

Figure 3:
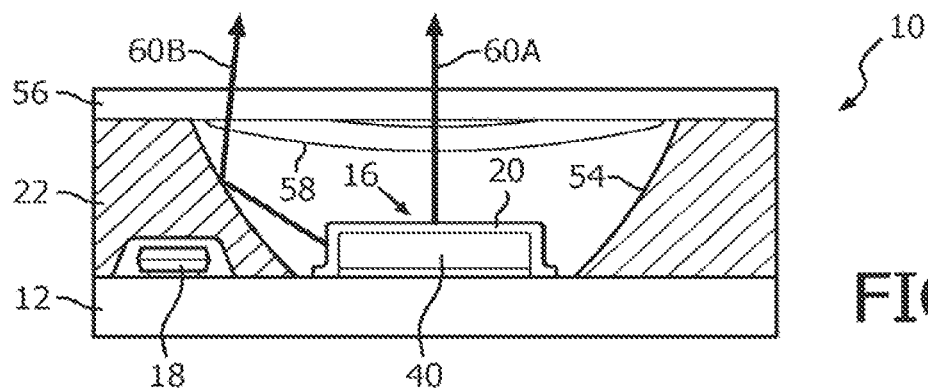
FIG. 3 is a cross-sectional view of the flash module of FIG. 1.

As shown by the cross-sectional view of the module 10 in FIG. 3, the lens 56 has a flat top surface and a bottom surface. A portion of the bottom surface is a convex surface 58 that faces the LED die 16. Thus, the convex surface does not add to the thickness of the module 10. Typically, the convex surface 58 is rectangular or rectangular with rounded corners, as shown in FIG. 1.

In prior art flash modules using LED dies that generate little side light, the lens had to be spaced relatively far front the top surface of the LED die to properly redirect the light. In one embodiment of present invent ion, around 40-50% of the light is emitted from the sides of the LED die 16, and the effective optical distance from the LED die 16 to the lens 56 is the sum of the generally horizontal distance from an LED die side to a reflector wall 54 plus the generally vertical distance from the reflector wall 54 to the lens 58. Accordingly, to make the module 10 even thinner, the reflector walls 54 can be further spaced from the LED die 16 while retaining the same effective optical distance between the sides and the lens 58. The lens 56 is designed to improve the uniformity of light across a central portion of the rectangular beam.

In one embodiment, the effective optical distance between the sides of the LED die 16 and the lens 58 is approximately the focal length of the lens 58.

Dry air (or other gas) fills the gap between the lens 56 and the LED die 16 to obtain a large difference in the indices of refraction at the interface of the lens 56 and the gap to achieve the desired refraction by the lens 56.

FIG. 3 shows two sample light rays 60A and 60B. Rays, such as 60A, from the top center surface of the LED die 16 are not substantially redirected by the lens 56. Reflected rays, such as ray 60B, that impinge the convex surface 58 at an angle are slightly redirected toward the center axis to improve the uniformity of the beam across at least a central portion of the 4:3 aspect ratio. The shape of the beam is primarily defined by the shape of the reflector 22, since the reflector 22 reflects virtually all side light and some angled light from the top surface of the LED die 16.

FIG. 3 also shows that the aluminum sheet for forming the reflector 22 is stamped to have a bottom cavity for the TVS chip 18.

By using the phosphor layer 20 (a dielectric) as an adhesive for the aluminum reflector 22, the bottom of the metal reflector 22 does not short out the metal traces 14, and there is no separate step for depositing an adhesive. In another embodiment, the reflector 22 is formed to have a thin dielectric layer on its bottom surface before being mounted on the substrate 12.

Figure 4:
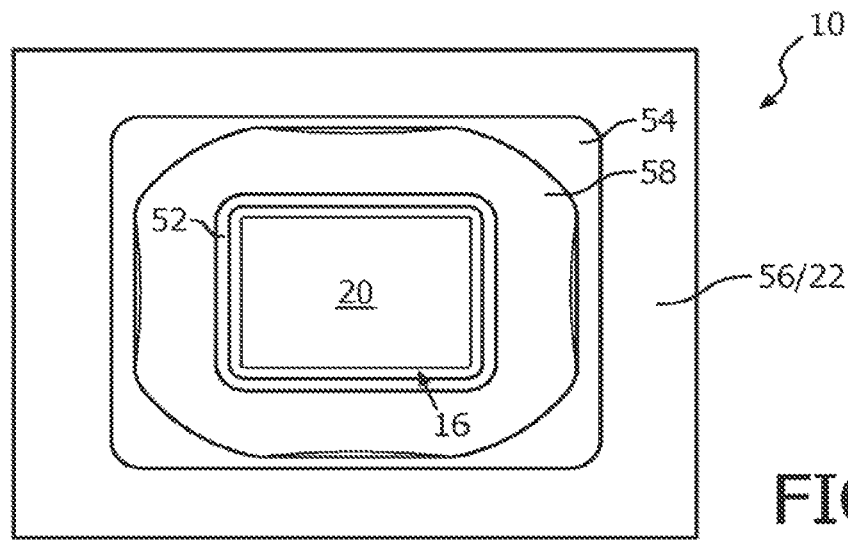
FIG. 4 is a top down view of the flash module of FIG. 1.

FIG. 4 is a top down view of the module 10 of FIG. 3.

Figure 5:
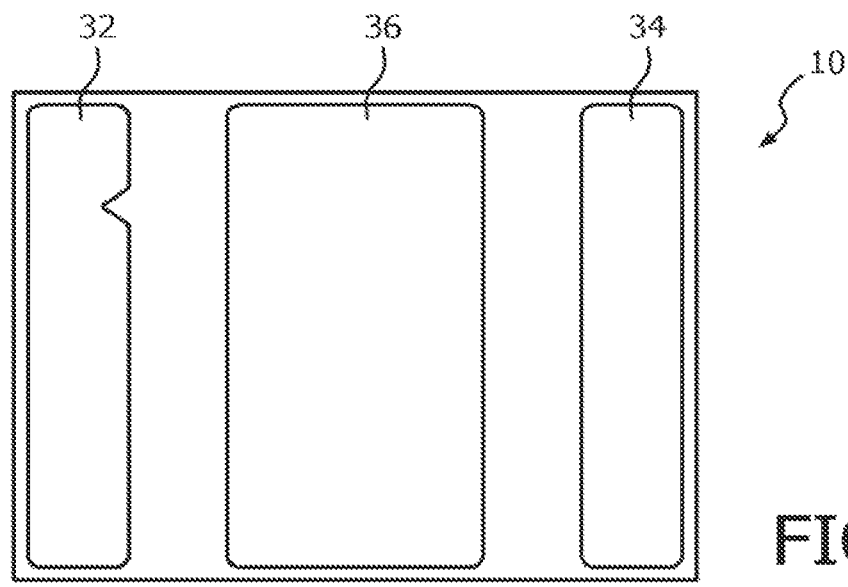
FIG. 5 is a bottom view of the flash module of FIG. 1 showing the electrode pattern and thermal pad.

FIG. 5 is a bottom view of the module 10 showing the cathode and anode bottom pads 32 and 34, and the thermal pad 36, also shown in FIG. 2.

Figure 6:
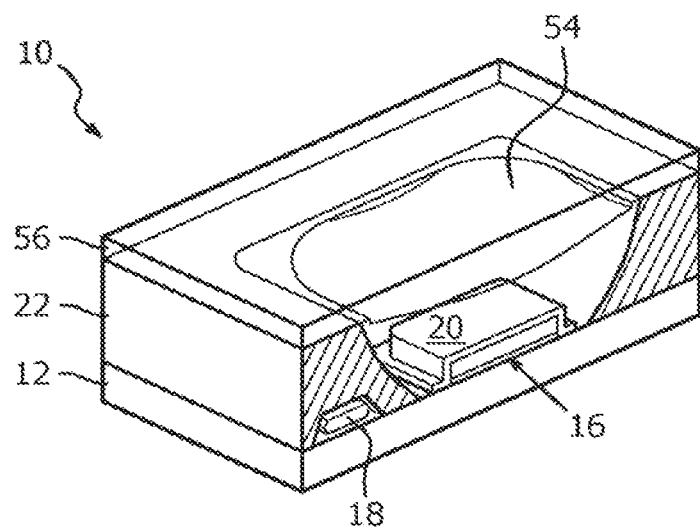
FIG. 6 is a perspective bisected view of the flash module of FIG. 1.

FIG. 6 is a perspective bisected view of the flash module 10. The phosphor layer 20 over the sides of the LED die 16 is not shown.

Figure 7:
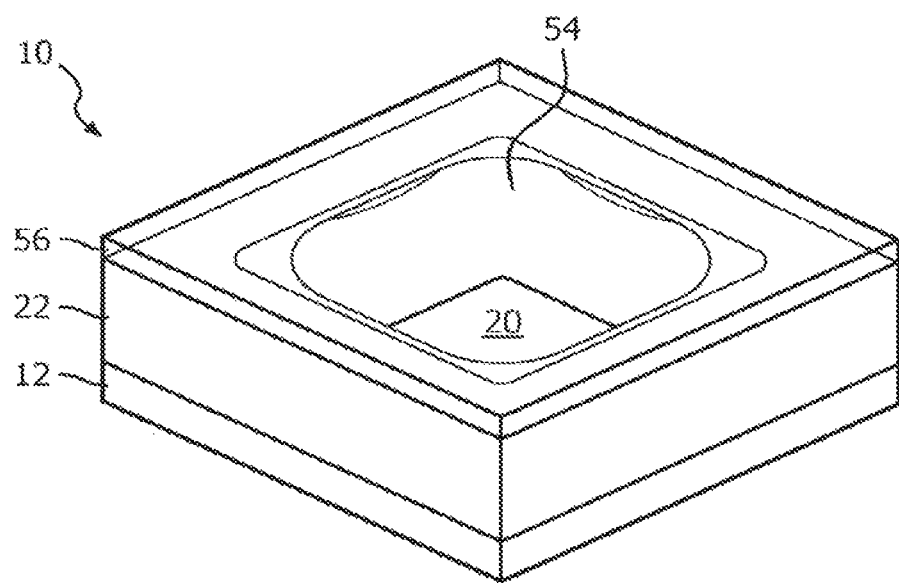
FIG. 7 is a perspective view of the flash module of FIG. 1.

FIG. 7 is a perspective view of the flash module 10 of FIG. 1.

Figure 8:
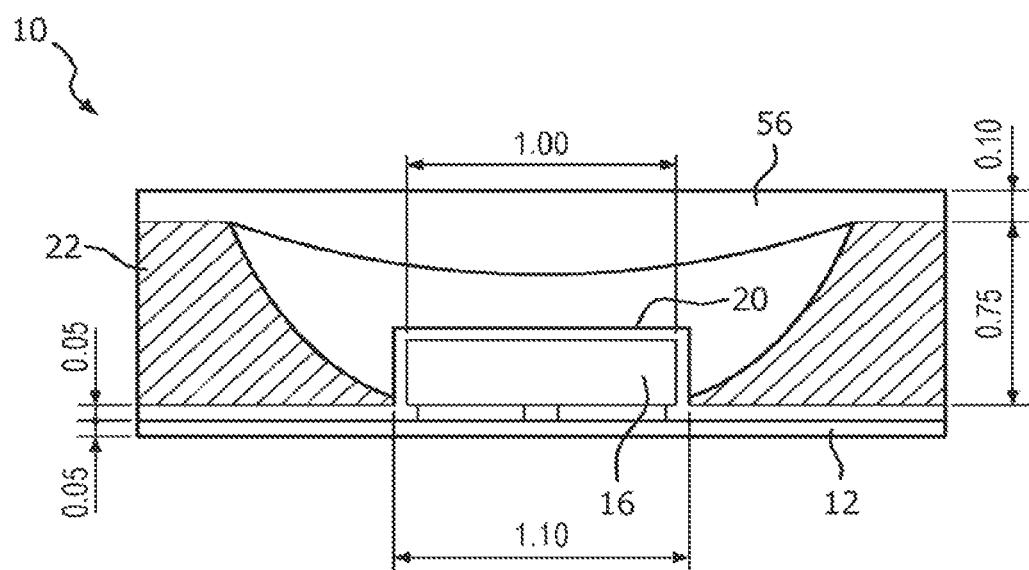
FIG. 8 is a cross-sectional view of an embodiment of the flash module using a flex substrate and identifying various dimensions in millimeters.

FIG. 8 is a cross-sectional view of an embodiment of the flash module 10 using a flex substrate 12 and identifying various dimensions in millimeters. Although the LED die 16 is about 1.0 mm in width, the height of the lens 56 above the top surface of the LED die 16 is only about 0.3 mm, since the optimal separation is based on the travel path of the side light to the lens 56 when being reflected off the reflector 22.

The flex substrate 12 only adds 0.05 mm to the thickness of the module 10. The phosphor layer 20 is shown as being 0.05 mm thick. The reflector 22 is shown as being 0.750 mm thick, and the lens 56 is shown as adding only 0.1 mm to the module 10. The growth substrate 40 (FIG. 2) may be about 0.25-0.5 mm thick. The total height of the flash module 10 of FIG. 8 is less than 1 mm. It is envisioned that all practical flash modules of the invention, using a flex circuit, can be formed to have thicknesses less than 2 mm.

Note that the top surface area of the LED die 16 is about 1 mm2 and the combined area of the four sides of the LED die, using a 0.5 mm thick substrate 40, is about 2 mm2. For a substrate 40 thickness of 0.25 mm, the side area equals the top surface area. So there is substantial side emission.

Figure 9:
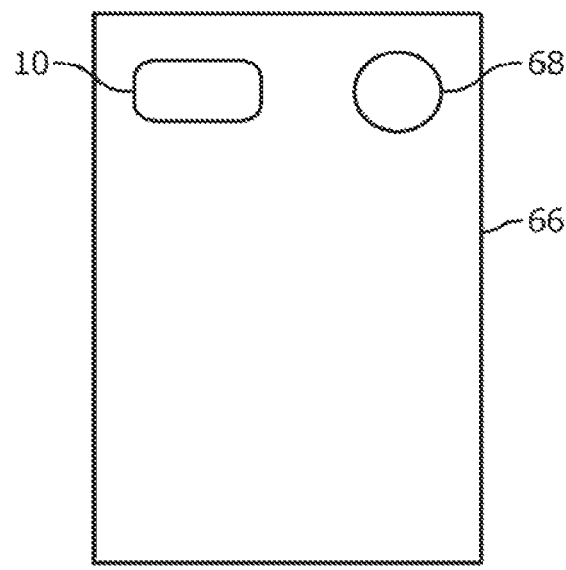
FIG. 9 is a back view of a smartphone illustrating the rectangular flash module and camera lens.

FIG. 9 is a back view of a smartphone 66, illustrating the rectangular flash module 10 and camera lens 68.

Accordingly, the present invention reduces the thickness of a flash module, improves the color uniformity across the beam, and increases the efficiency of the flash by creating a generally rectangular beam with a substantially uniform intensity across the relevant portion of the beam and by incurring less reflection of the LED light back toward the LED die.

The present invention may be used for other applications besides camera flashes, such as a flashlight module.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed:

1. An illumination system, comprising:
    a light emitting diode (LED) die having a plurality of side surfaces that are configured to emit light; and a reflector having curved surfaces that surround the LED die, the curved surfaces configured to reflect the emitted light from the side surfaces of the LED die into a generally pyramidal beam having a generally rectangular cross-section.

2. The illumination system of claim 1, further comprising a lens configured to receive the generally pyramidal beam, the lens having a generally rectangular convex surface extending toward the LED die and a generally planar surface facing away from the LED die.

3. The illumination system of claim 1, further comprising a substrate, the LED die being mounted on the substrate.

4. The illumination system of claim 3, wherein:
the substrate has a generally rectangular footprint; and
the reflector has a generally rectangular footprint that is sized and shaped to generally match the generally rectangular footprint of the substrate.

5. The illumination system of claim 4, further comprising a lens configured to receive the generally pyramidal beam, the lens having a generally rectangular footprint that is sized and shaped to generally match the generally rectangular footprints of the substrate and the reflector.

6. The illumination system of claim 1, wherein the reflector includes a top surface and a bottom surface, such that the curved surfaces of the reflector define a cavity that extends through the reflector from the bottom surface to the top surface, the cavity defining a longitudinal axis, the top surface and the bottom surface being parallel to each other and orthogonal to the longitudinal axis, the top surface and the bottom surface each extending peripherally around the cavity around a perimeter of the reflector.

7. The illumination system of claim 6, wherein the bottom surface of the reflector is affixed to a substrate, the LED die being mounted on the substrate.

8. The illumination system of claim 6, wherein the top surface of the reflector is affixed to a lens configured to receive the generally pyramidal beam.

9. The illumination system of claim 8, wherein the lens comprises preformed polycarbonate.

10. The illumination system of claim 8, wherein:
the LED die, the reflector, and the lens are configured as a flash module for a camera;
the camera has a field of view that has a first aspect ratio; and
the generally pyramidal beam has a second aspect ratio that matches the first aspect ratio.

11. The illumination system of claim 1, further comprising a phosphor layer covering the plurality of side surfaces of the LED die.

12. The illumination system of claim 11, wherein:
the LED die is configured to emit blue light;
the phosphor layer is configured to absorb at least a portion of the emitted blue light and emit phosphor light; and
a non-absorbed portion of the blue light and the phosphor light, combined, form a white light.

13. The illumination system of claim 1, wherein the reflector comprises stamped aluminum.

14. The illumination system of claim 13, wherein the curved surfaces of the reflector are coated with a silver layer, the silver layer having a higher reflectivity than bare aluminum.

15. The illumination system of claim 1, wherein the LED die further includes a top surface that is configured to emit light, such that the light emitted by the plurality of the side surfaces is between 40% and 50% of the total light emitted by the LED die.

16. A method for providing illumination, the method comprising:
emitting, with a light emitting diode (LED) die having a plurality of side surfaces, light substantially from the plurality of side surfaces; and
reflecting, with a reflector having curved surfaces that surround the LED die, the emitted light from the side surfaces of the LED die into a generally pyramidal beam having a generally rectangular beam cross-section.

17. The method of claim 16, wherein:
the LED die is mounted on a substrate;
the substrate has a generally rectangular footprint; and
the reflector has a generally rectangular footprint that is sized and shaped generally to match the generally rectangular footprint of the substrate.

18. The method of claim 16, wherein:
the LED die and the reflector are configured as a flash module for a camera;
the camera has a field of view that has a first aspect ratio; and
the generally pyramidal beam has a second aspect ratio that substantially matches the first aspect ratio.

19. An illumination system, comprising:
a substrate having a generally rectangular footprint;
a light emitting diode (LED) die mounted on the substrate, the LED die having a plurality of side surfaces that are oriented substantially orthogonal to the substrate and configured to emit blue light;
a phosphor layer covering the plurality of side surfaces of the LED die, the phosphor layer configured to absorb at least a portion of the emitted blue light and emit phosphor light, such that a non-absorbed portion of the blue light and the phosphor light, combined, form a white light; and
a reflector having a generally rectangular footprint that is sized and shaped to generally match the generally rectangular footprint of the substrate, the reflector having curved surfaces that surround the LED die, the curved surfaces configured to reflect the white light from the side surfaces of the LED die into a generally pyramidal beam having a generally rectangular cross-section.

20. The illumination system of claim 19, wherein:
the LED die and the reflector are configured as a flash module for a camera;
the camera has a field of view that has a first aspect ratio; and
the generally pyramidal beam has a second aspect ratio that substantially matches the first aspect ratio.

* * * * *